United States Patent
Vashchenko

(10) Patent No.: US 8,299,531 B1
(45) Date of Patent: Oct. 30, 2012

(54) CMOS ESD CLAMP WITH INPUT AND SEPARATE OUTPUT VOLTAGE TERMINAL FOR ESD PROTECTION

(75) Inventor: Vladislav Vashchenko, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 2777 days.

(21) Appl. No.: 10/033,579

(22) Filed: Dec. 27, 2001

(51) Int. Cl.
H01L 23/62 (2006.01)

(52) U.S. Cl. .................. 257/355; 257/E23.002

(58) Field of Classification Search .................. 257/355, 257/356, 357, 358, 359, 360, 361, 362, 363
See application file for complete search history.

(56) References Cited

U.S. PATENT DOCUMENTS

| | | | | |
|---|---|---|---|---|
| 5,019,888 A | * | 5/1991 | Scott et al. | |
| 5,547,881 A | * | 8/1996 | Wang et al. | 438/384 |
| 5,565,698 A | * | 10/1996 | Obermeier | 257/360 |
| 6,268,286 B1 | * | 7/2001 | Gauthier et al. | 438/655 |
| 6,320,231 B1 | * | 11/2001 | Ikehashi et al. | 257/355 |
| 6,407,445 B1 | * | 6/2002 | Vashchenko et al. | 257/630 |
| 6,531,745 B1 | * | 3/2003 | Woolery et al. | 257/363 |

* cited by examiner

*Primary Examiner* — Ha Tran T Nguyen
*Assistant Examiner* — Kevin Quinto
(74) *Attorney, Agent, or Firm* — Wade J. Brady, III; Frederick J. Telecky, Jr.

(57) ABSTRACT

In a snapback NMOS ESD protection structure, the output voltage presented to an internal circuit for ESD protection is limited by providing for a separate output terminal at a lower voltage than the input terminal. The voltage drop between the two terminals is achieved by connecting the input and output terminals to different parts of a ballast region of the structure and using the saturation resistance of the portion of the ballast region between the terminals to achieve the voltage drop.

4 Claims, 4 Drawing Sheets

CMOS ESD CLAMP WITH INPUT AND SEPARATE OUTPUT VOLTAGE TERMINAL FOR ESD PROTECTION

FIELD OF THE INVENTION

The invention relates to ESD protection solutions. In particular, it relates to a GGNMOS based ESD protection solution.

BACKGROUND OF THE INVENTION

For relatively small integrated circuits, over-voltage I/O's and most radio frequency analog a typical electrostatic discharge (ESD) protection solution is the use of a local clamp. Typically a clamp is placed between the I/O pin or pad and ground. This acts as a short circuit path for high ESD pulse current in both directions. In the positive direction, the clamp provides high triggering voltage and is chosen according to the I/O signal range. In the negative direction, a diode (either an extra external diode, or an internal body diode such as the body diode of the triggering structure.

A typical triggering element for local CMOS ESD clamps is a so-called grounded gate snapback NMOS (GGNMOS), or its cascoded version that is used for overvoltage cell protection, as illustrated in FIG. 1, which shows a GGNMOS 10 protecting a driver circuit in the form of an invertor 12. In fact, in 80% to 90% of CMOS applications, grounded gate snapback N-MOS structures are the protection solution used. These work adequately during pulsed ESD operation but experience difficulties at continuous excessive currents or very high currents. The limited energy dissipation capabilities of grounded gate N-MOS ESD protection clamps can be attributed to the extremely localized region for heat dissipation, which corresponds to approximately a 0.5 µm region near the gate-drain region. Based on human body model (HBM) measurements, the peak critical power that can typically be handled by grounded gate N-MOS devices is no more than 50-100 mW per micron of contact width. Thus for a 6-8 V holding voltage, the current must not exceed 5-15 mA/µm. Nevertheless, because of their relatively small size, they continue to be commonly used in small integrated circuits, overvoltage I/O's and radio frequency analog applications.

In its simplest form, a N-MOS snapback device includes a gate defined by a poly layer, and a source and drain in the form of an n+ regions. A snapback GGNMOS device is characterized by an unsilicided drain ballasting region which defines a serial n+ distributed saturation resistance. A plot of the IV characteristics of such a snapback device is illustrated in FIG. 2. As mentioned above, the snapback device is characterized by the inclusion of a ballasting region. In the absence of a ballasting region, current would increase virtually unchecked after triggering at $V_{TR}$ 21 and only taper off at extreme currents due to increased resistance, as is shown by the curve 20. The IV characteristics of a distributed resistance such as the un-silicided portion is shown by curve 22 in FIG. 2, which shows a clear saturation current curve. The combined effect of including the ballast region for the snapback NMOS device is shown by curve 24. Thus the drain ballasting region 30, which typically has a length of approximately 3-6 µm and is shown in cross-section in FIG. 3, dumps the spatial current instability in the composite part of the GGNMOS. This built in saturation resistor region is already part of any snapback NMOS device and, after triggering due to an ESD pulse, GGNMOS has been shown to result in current saturation in the ballasting region 30.

However, while the ballasting region helps to limit spatial current fluctuations, its resistance causes an increased operation voltage of the ESD clamp as current increases. This increased voltage is presented to the internal circuitry 12 (FIG. 1) and can significantly exceed the critical voltage capabilities of the internal circuitry 12 under pulse conditions. According to Transmission Line Pulse (TLP) measurements, this is less of a concern for the GGNMOS device itself since the GGNMOS characteristics provide reliable ESD operation of more than twice the holding voltage value. However, this so-called VT2 value comes with a corresponding IT2 increase which results in critical dissipated power and a danger of thin oxide damage to the internal I/O driver 12 (which is presented as a CMOS invertor in FIG. 1). Typically this will occur much sooner than burnout of the GGNMOS.

Already in the case of 0.18 µm/3.3V technology but even more so with future scaling down which will result in reduced operating voltage and corresponding reduced gate oxide thickness and reduced breakdown voltage, the problem of how to build proper ESD snapback devices with the appropriate triggering characteristics and layout will become a challenge. This is especially true when high frequency issues are taken into account.

SUMMARY OF THE INVENTION

The invention provides a new NMOS ESD protection structure by making use of the saturation resistance of the ballast region to provide a potential drop, by providing the NMOS protection structure with a separate output terminal at the reduced potential difference during a high current ESD event. The new approach to ESD protection using a NMOS snapback device thus provides for the separation of the input and output voltages of the device during ESD events.

According to the invention, there is provided a snapback NMOS ESD protection structure having a n+ ballast region, and a drain terminal, wherein the structure includes an additional drain contact to the ballast region. The additional drain contact serves as an output terminal while the original drain terminal serves as an input terminal. During an ESD pulse, a voltage drop is created between the terminals to provide for a lower output voltage on the output terminal.

Further, according to the invention, there is provided a method of reducing the output voltage from a snapback NMOS structure which forms the input to an internal circuit that is being protected against ESD events, wherein the method comprises separating the input and output voltages of the structure by a potential drop across at least part of a ballast region of the structure under an ESD event.

Still further, according to the invention, there is provided a method of providing a snapback NMOS structure having a n+ ballast region between a drain and a gate, comprising attaching an extra terminal between the drain and the gate.

Still further, according to the invention, there is provided a method of reducing the size of a snapback NMOS ESD protection structure, comprising providing for separate internal output and input terminals to the structure and implementing a voltage drop across the terminals to accommodate a higher internal input voltage than internal output voltage.

DETAILED DESCRIPTION OF THE INVENTION

Figure 4:
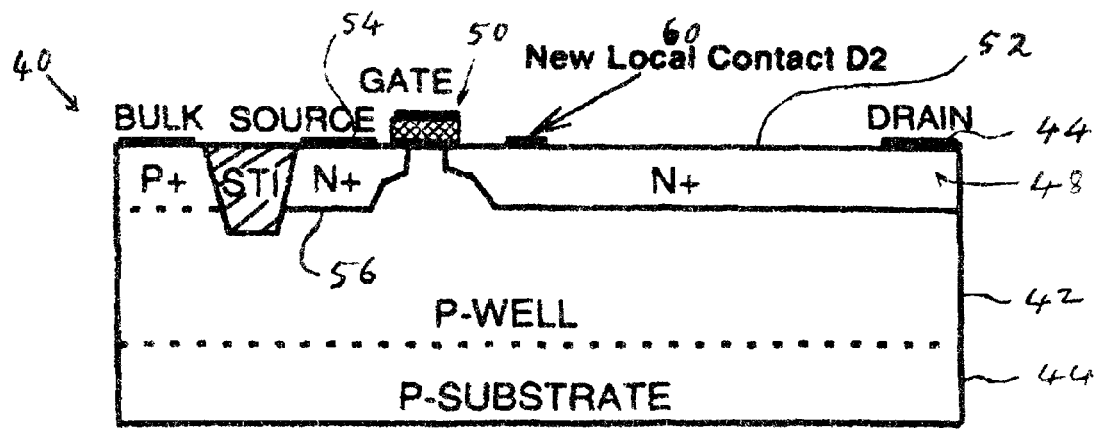
FIG. 4 is a sectional representation of a snapback GGNMOS structure of the invention.

FIG. 4 illustrates one embodiment of the present invention. The NMOS structure 40 consists of a p-well 42 formed in a p-substrate 44. A drain contact 46 is connected to a n+ drain region 48 which is connected to a gate 50 by a n+ ballast region 52. The structure, further, includes a source contact 54 connected to a n+ source regions 56. The invention is based on the separation of the input and output voltages to the NMOS device. In order to make this possible, an extra contact or terminal 60 is attached between the drain metal (silicide) contact 44 and the gate 50.

Figure 1:
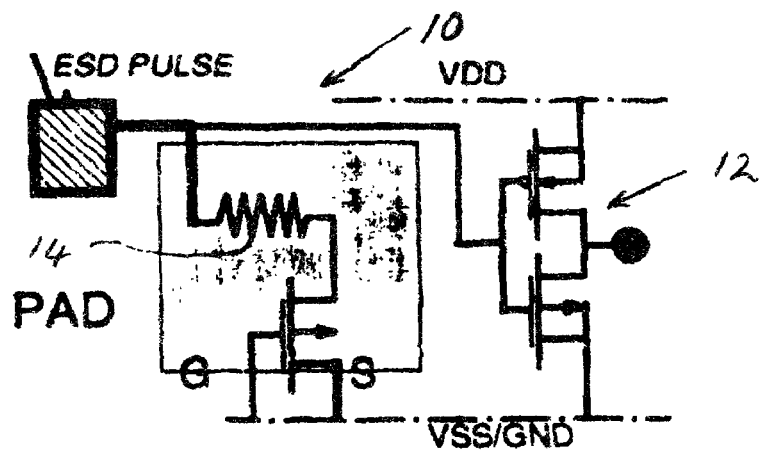
FIG. 1 is a schematic circuit diagram of a prior art GGNMOS ESD protection clamp connected to a CMOS invertor.
Figure 2:
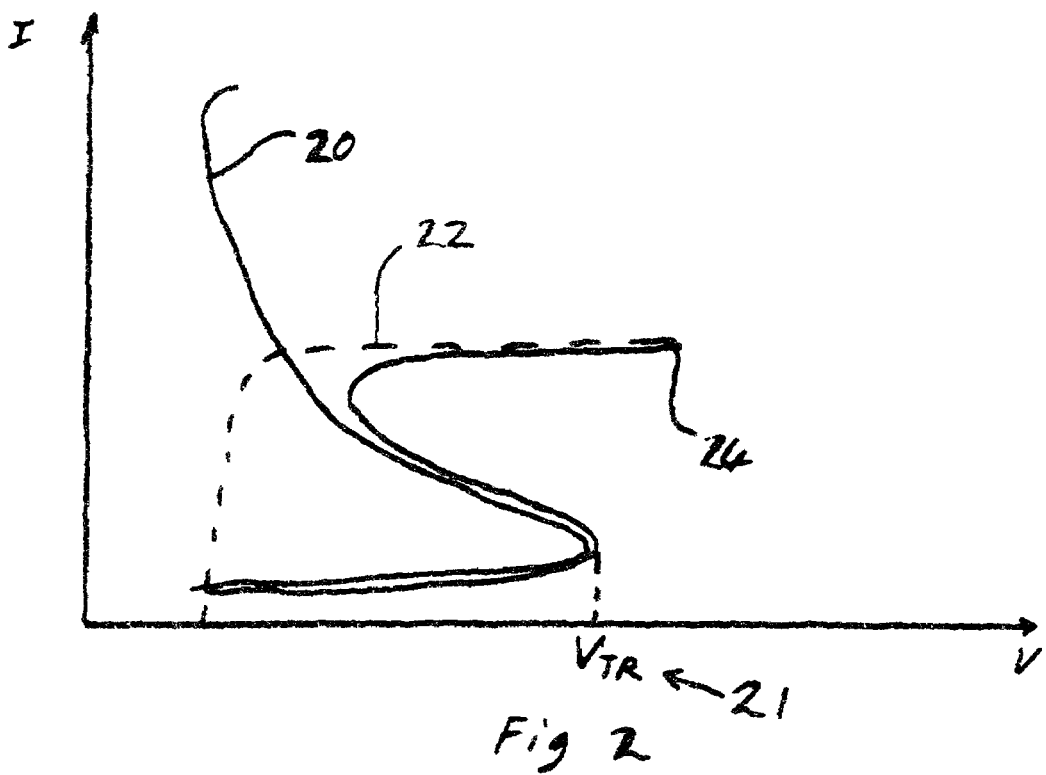
FIG. 2 is a set of I-V curves.
Figure 3:
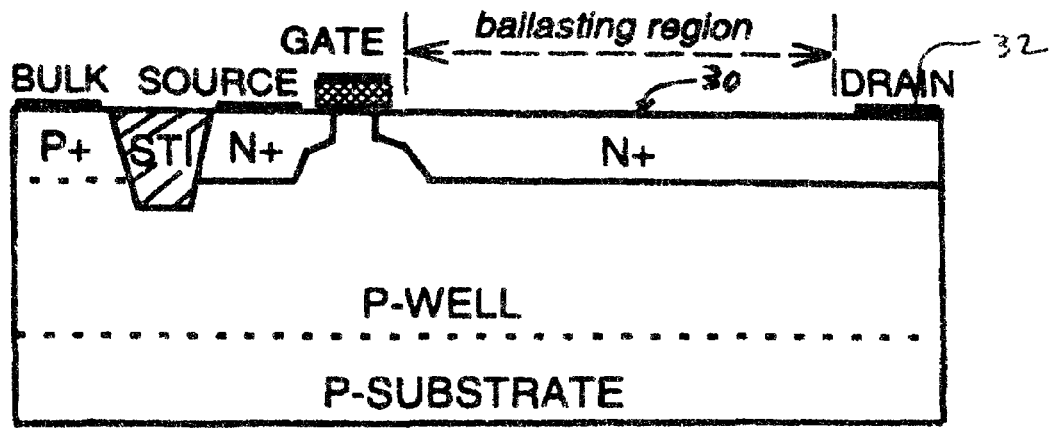
FIG. 3 is a sectional representation of a prior art snapback GGNMOS structure.
Figure 5:
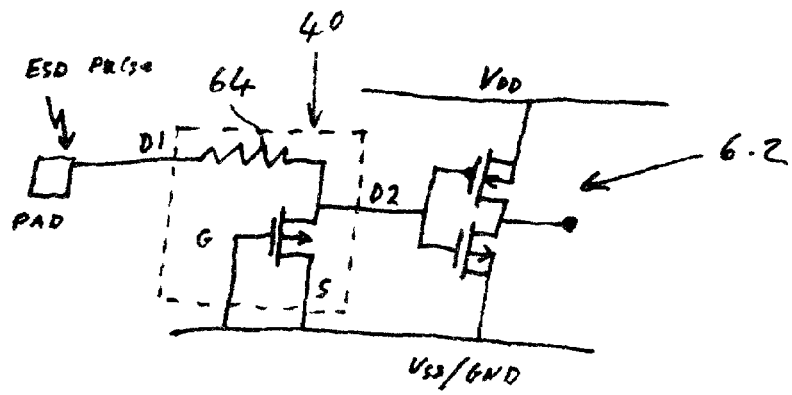
FIG. 5 is a schematic representation of a snapback structure of the invention connected to a CMOS invertor.

FIG. 5 shows a schematic circuit diagram of the NMOS device 40 connected as a snapback wounded gate NMOS (GGNMOS) ESD protection structure to an inverter circuit 62. Snapback NMOS structures used as ESD protection clamps are often connected with their gates grounded. As a result the term GGNMOS is commonly used, even though the gate need not necessarily be connected to ground but could be connected to some or other driver. Referring again to FIGS. 4 and 5, the portion of the ballast region 52 that extends between the drain contact 44 and the new contact 60 forms a resistor between the input terminal (drain contact 44) and the output terminal (new contact 60), and is represented in FIG. 5 as a resistor 64. Thus the additional contact 60 of the present invention splits the input voltage to provide a lower output voltage that is then presented to the circuit being protected (in this case the inverter 62). This is in contrast to the prior art structure in which the input terminal (drain 32 in FIG. 30) is also the output terminal. Thus there is no part of the ballast region 30 (FIG. 3) that provides a voltage drop between an input and output terminal. The entire input voltage including the voltage across the ballast region 30 is presented to the output, as is illustrated by the resistor 14 in FIG. 4, which depicts the ballast resistance of the ballast 30

Figure 6:
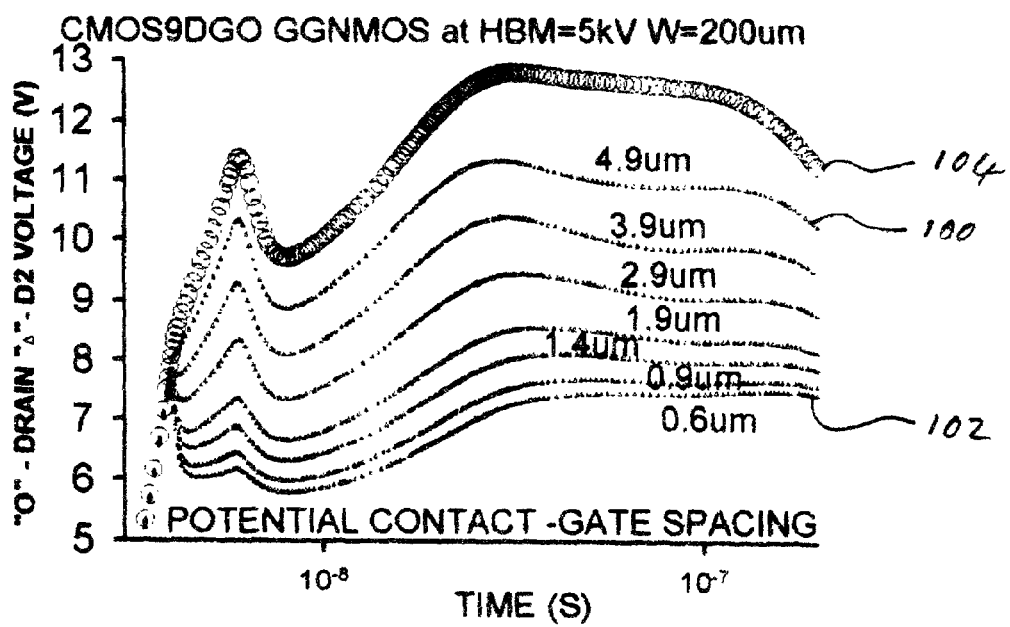
FIG. 6 shows voltage-time curves for a prior art snapback structure and snapback structures of the invention, for different distances of the output contact from the gate, FIG. 7 voltage-current curves for the input and output contacts of one embodiment of a snapback structure of the invention.

During ESD operation with high pulsed current, the voltage drop across the portion of the ballasting region between the two contacts 44,60 results in a corresponding electrical potential distribution. The voltage at the added contact 66 depends on its position inside the ballasting region 52 and can be made significantly lower than the voltage at the drain contact 44. This key feature of the internal potential distribution during ESD operation is proven using TOAD tools, as shown in FIG. 6. As the distance between the gate 50 and the new contact 66 is reduced from 4.9 μm (curve 100) to 0.6 μm (curve 102) the voltage on the new output terminal 66 drops from a high of just over 11 V to a high of a little over 7 V. In contrast, the voltage on the input terminal (drain contact 44), as given by curve 104, reaches a high of about 13 V, thus the significant potential difference between the input and output terminals is apparent. During a high current ESD event the large voltage drop across the resistance 64 ensures that the potential on the output contact 60 remains significantly lower (around the holding voltage of approximately 5-6V of the internal circuit being protected, i.e. the inverter 62 in FIG. 5). Therefore, even under critical levels of overload, resulting in power diode burnout of the ESD protection circuit, the internal circuit remains protected against the risk of gate oxide damage.

Figure 7:
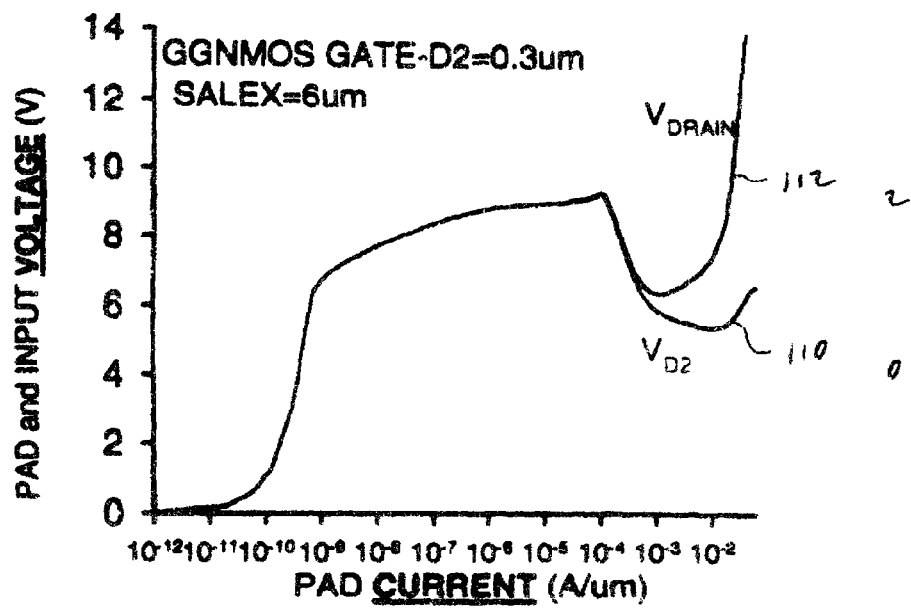

The I-V curve 110 of one embodiment of the invention, in which the new output contact was spaced 0.3 μm from the gate, is shown in FIG. 7. The curve 110 shows the output voltage being maintained at approximately the holding voltage of the internal circuit even though the voltage at the input terminal (curve 112) continues to rise as the current increases.

It will be appreciated that in the absence of an ESD pulse, under normal operation, the resistance 64 of the portion of the ballast region between the input and output terminals adds some additional resistance to the input of the protected circuit. However, the effect of the resistance 64 is negligible. Due to the rather low n r composite (ballast) sheet resistance (less than 80 Ω/sq) the resistor 64 value is negligible, ranging between about 1 and 10Ω depending on the device dimensions and the position of the contact 60.

It will be appreciated that the present invention provides numerous advantages. By being able to adjust the output voltage of the clamp, any NMOS structure with the proper power is suitable for protection of internal circuitry, since the voltage to the internal circuitry under an ESD pulse can be limited to around the holding voltage level.

Figure 8:
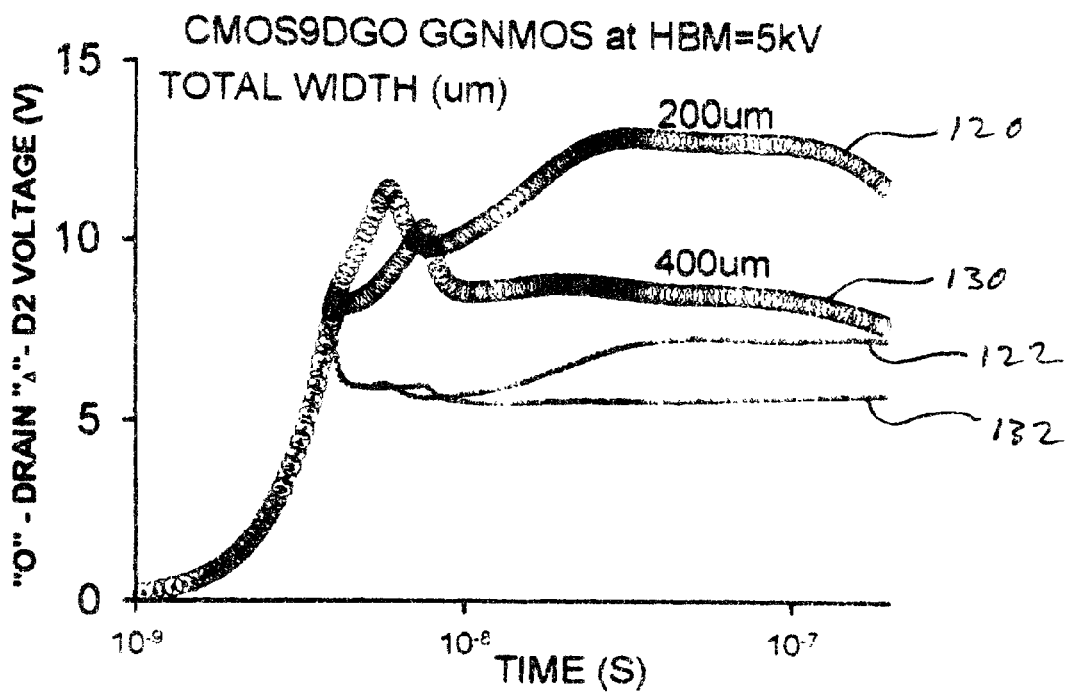
FIG. 8 shows voltage-time curves for different embodiments of the snapback structure of the invention

A further advantage of the present invention, is the ability to reduce the size of the protection device. TOAD measurements taken for different width structures to compare the input and output voltages over time. These are illustrated in FIG. 8 in which the input voltage for a 200 μm structure is given by curve 120. The output voltage for the same structure is given by curve 122, and is shown to remain near the holding voltage level. As the width of the structure is increased to 400 μm, both the input voltage (curve 130) and output voltage (curve 132) decrease due to the larger size of the structure to handle the ESD current pulse. From these test results, it is clear that the output voltage of the 200 μm structure is lower than the input voltage of even the 400 μm structure. Thus, the present invention allows smaller protection devices to be implemented without exceeding the holding voltage of the internal circuit that is being protected.

It will be appreciated that, although only one additional contact was described above, an embodiment could have more than one additional contact to achieve several outputs at different voltages.

While the present invention has been described with respect to specific embodiments, it will be appreciated that the benefits of the invention can be realized using other implementations and configurations without departing from the scope of the claims.

What is claimed is:

1. A method of protecting a primary circuit by means of a snapback NMOS ESD protection structure that includes a source, a gate and a drain, the drain comprising a drain input terminal and an unsilicided ballast region, the method comprising
   providing the NMOS ESD protection structure with an output terminal connected to the ballast region and separated from the drain input terminal by a potential drop across at least part of a ballast region of the structure,
   connecting the NMOS ESD protection structure between a pad and ground, and
   connecting the output terminal to an input of the primary circuit.

2. A method of claim 1, wherein the voltage drop is chosen to ensure that the output voltage does not exceed the holding voltage of the primary circuit.

3. A method of providing a primary circuit with ESD protection by means of a snapback NMOS ESD protection structure while limiting the voltage over the primary circuit during an ESD event prior to triggering of the snapback NMOS ESD protection structure, the NMOS ESD protection structure having a drain, a source, and a gate, the drain including a silicided drain region, and an unsilicided drain ballast region extending between the silicided drain region and the gate, the method comprising providing a drain input terminal to the silicided drain region of the snapback NMOS structure providing a separate drain output terminal from the drain ballast region of the snapback NMOS structure, and connecting the drain output terminal to an input of the primary circuit.

4. A method of claim 3, further comprising providing for additional output terminals at different voltage drops relative to the input terminal.

* * * * *